US008236382B2

(12) United States Patent
Ravkin et al.

(10) Patent No.: US 8,236,382 B2
(45) Date of Patent: Aug. 7, 2012

(54) PROXIMITY SUBSTRATE PREPARATION SEQUENCE, AND METHOD, APPARATUS, AND SYSTEM FOR IMPLEMENTING THE SAME

(75) Inventors: Michael Ravkin, Sunnyvale, CA (US); John M. de Larios, Palo Alto, CA (US); Mikhail Korolik, San Jose, CA (US); Michael G. R. Smith, Dublin, CA (US); Carl Woods, Aptos, CA (US)

(73) Assignee: Lam Research Corporation, Fremont, CA (US)

( * ) Notice: Subject to any disclaimer, the term of this patent is extended or adjusted under 35 U.S.C. 154(b) by 773 days.

(21) Appl. No.: 10/882,716

(22) Filed: Jun. 30, 2004

(65) Prior Publication Data

US 2005/0158473 A1 Jul. 21, 2005

Related U.S. Application Data

(63) Continuation-in-part of application No. 10/816,432, filed on Mar. 31, 2004, now Pat. No. 7,045,018, and a continuation-in-part of application No. 10/261,839, filed on Sep. 30, 2002, now Pat. No. 7,234,477, and a continuation-in-part of application No. 10/404,270, filed on Mar. 31, 2003, now Pat. No. 7,069,937, which is a continuation-in-part of application No. 10/261,839, filed on Sep. 30, 2002, now Pat. No. 7,234,477.

(51) Int. Cl.
*B05D 3/00* (2006.01)
*B05D 3/10* (2006.01)

(52) U.S. Cl. ......... 427/294; 427/299; 427/307; 427/337

(58) Field of Classification Search ................ 134/95.1, 134/95.2, 95.3, 99.1, 166 R, 167 R, 198, 134/902; 427/299; 34/407
See application file for complete search history.

(56) References Cited

U.S. PATENT DOCUMENTS

| 3,953,265 | A | | 4/1976 | Hood |
| 4,086,870 | A | | 5/1978 | Canavello et al. |
| 4,230,770 | A | * | 10/1980 | Roennau et al. ........... 428/424.4 |
| 4,367,123 | A | | 1/1983 | Beck |
| 4,444,492 | A | | 4/1984 | Lee |
| 4,838,289 | A | | 6/1989 | Kottman et al. |
| 4,937,275 | A | * | 6/1990 | Kooijmans et al. ........... 523/404 |
| 5,102,494 | A | | 4/1992 | Harvey et al. |
| 5,180,431 | A | | 1/1993 | Sugimoto et al. |

(Continued)

FOREIGN PATENT DOCUMENTS

EP        0 905 746 A1     3/1999

(Continued)

OTHER PUBLICATIONS

U.S. Appl. No. 11/173,729, filed Jun. 30, 2005, Ravkin et al.

(Continued)

*Primary Examiner* — Michael Kornakov
*Assistant Examiner* — Nicole Blan
(74) *Attorney, Agent, or Firm* — Martine Penilla Group, LLP

(57) ABSTRACT

A method for preparing a surface of a substrate is provided. The method includes scanning the surface of the substrate by a meniscus, preparing the surface of the substrate using the meniscus, and performing a next preparation operation on the surface of the substrate that was prepared without performing a rinsing operation.

14 Claims, 9 Drawing Sheets

U.S. PATENT DOCUMENTS

| | | | |
|---|---|---|---|
| 5,271,774 A | | 12/1993 | Leenaars et al. |
| 5,294,257 A | | 3/1994 | Kelly et al. |
| 5,343,234 A | | 8/1994 | Kuehnle |
| 5,361,449 A | | 11/1994 | Akimoto |
| 5,472,502 A | | 12/1995 | Batchelder |
| 5,472,734 A | * | 12/1995 | Perrotta et al. .................. 427/2.1 |
| 5,558,111 A | | 9/1996 | Lofaro |
| 5,601,655 A | * | 2/1997 | Bok et al. ........................... 134/1 |
| 5,660,642 A | | 8/1997 | Britten |
| 5,705,223 A | | 1/1998 | Bunkofske |
| 5,709,757 A | | 1/1998 | Hatano et al. |
| 5,807,522 A | | 9/1998 | Brown et al. |
| 5,830,334 A | | 11/1998 | Kobayashi |
| 5,882,433 A | | 3/1999 | Ueno |
| 5,893,004 A | | 4/1999 | Yamamura |
| 5,945,351 A | | 8/1999 | Mathuni |
| 5,975,098 A | | 11/1999 | Yoshitani et al. |
| 5,989,478 A | | 11/1999 | Ouellette et al. |
| 5,997,653 A | | 12/1999 | Yamasaka |
| 6,086,454 A | | 7/2000 | Watanabe et al. |
| 6,092,937 A | | 7/2000 | Snodgrass et al. |
| 6,103,636 A | | 8/2000 | Zahorik et al. |
| 6,108,932 A | | 8/2000 | Chai |
| 6,132,586 A | | 10/2000 | Adams et al. |
| 6,214,513 B1 | | 4/2001 | Cai et al. |
| 6,218,290 B1 | * | 4/2001 | Schonauer et al. ............ 438/633 |
| 6,230,722 B1 | * | 5/2001 | Mitsumori et al. ....... 134/122 R |
| 6,328,814 B1 | * | 12/2001 | Fishkin et al. ................... 134/30 |
| 6,341,998 B1 | | 1/2002 | Zhang |
| 6,391,166 B1 | | 5/2002 | Wang |
| 6,398,975 B1 | | 6/2002 | Mertens et al. |
| 6,417,117 B1 | | 7/2002 | Davis |
| 6,433,541 B1 | | 8/2002 | Lehman et al. |
| 6,446,358 B1 | | 9/2002 | Mitsumori et al. |
| 6,474,786 B2 | | 11/2002 | Percin et al. |
| 6,488,040 B1 | | 12/2002 | De Larios et al. |
| 6,491,764 B2 | | 12/2002 | Mertens et al. |
| 6,495,005 B1 | | 12/2002 | Colgan et al. |
| 6,514,570 B1 | | 2/2003 | Matsuyama et al. |
| 6,530,823 B1 | | 3/2003 | Ahmadi et al. |
| 6,531,206 B2 | | 3/2003 | Johnston et al. |
| 6,550,988 B2 | | 4/2003 | Sugimoto et al. |
| 6,555,017 B1 | | 4/2003 | Rushford et al. |
| 6,616,772 B2 | | 9/2003 | De Larios et al. |
| 6,629,540 B2 | | 10/2003 | Mitsumori et al. |
| 6,689,323 B2 | | 2/2004 | Fisher et al. |
| 6,764,720 B2 | | 7/2004 | Pui et al. |
| 6,954,993 B1 | | 10/2005 | Smith et al. |
| 6,988,326 B2 | | 1/2006 | O'Donnell et al. |
| 2001/0032829 A1 | * | 10/2001 | Honda et al. .................. 216/108 |
| 2001/0042559 A1 | * | 11/2001 | Mertens et al. ................. 134/31 |
| 2001/0052351 A1 | * | 12/2001 | Brown et al. ..................... 134/2 |
| 2002/0020622 A1 | | 2/2002 | Hanson et al. |
| 2002/0102852 A1 | * | 8/2002 | Verhaverbeke et al. ...... 438/690 |
| 2002/0121290 A1 | * | 9/2002 | Tang et al. ........................ 134/6 |
| 2002/0125212 A1 | | 9/2002 | Mertens et al. |
| 2002/0142622 A1 | * | 10/2002 | Iijima et al. .................... 438/768 |
| 2003/0091745 A1 | | 5/2003 | Yogev et al. |
| 2003/0091754 A1 | | 5/2003 | Chihani et al. |
| 2004/0060195 A1 | | 4/2004 | Garcia et al. |
| 2004/0060573 A1 | | 4/2004 | Woods |
| 2004/0060581 A1 | | 4/2004 | Garcia et al. |
| 2004/0069319 A1 | | 4/2004 | Boyd et al. |
| 2004/0069326 A1 | | 4/2004 | Woods et al. |
| 2004/0069329 A1 | | 4/2004 | De Larios et al. |
| 2004/0136494 A1 | | 7/2004 | Lof et al. |
| 2004/0178060 A1 | | 9/2004 | Ravkin et al. |
| 2004/0182422 A1 | | 9/2004 | Boyd et al. |
| 2005/0132515 A1 | | 6/2005 | Boyd et al. |
| 2005/0139318 A1 | | 6/2005 | Woods et al. |
| 2005/0145267 A1 | | 7/2005 | Korolik et al. |
| 2005/0145268 A1 | | 7/2005 | Woods |
| 2005/0148197 A1 | | 7/2005 | Woods et al. |
| 2005/0217703 A1 | | 10/2005 | O'Donnell |
| 2006/0064895 A1 | | 3/2006 | Garcia et al. |

FOREIGN PATENT DOCUMENTS

| | | |
|---|---|---|
| EP | 0 905 747 A1 | 3/1999 |
| EP | 1 489 461 A1 | 12/2004 |
| EP | 1 489 462 A2 | 12/2004 |
| JP | 05837190 | 3/1983 |
| JP | 62150828 | 7/1987 |
| JP | 02280330 | 11/1990 |
| JP | 02309638 | 12/1990 |
| JP | 08277486 | 10/1996 |
| JP | 11-31672 | 2/1999 |
| JP | 11350169 | 12/1999 |
| JP | 2003-151948 | 5/2003 |
| WO | WO 99/16109 A1 | 4/1999 |
| WO | WO 99/49504 | 9/1999 |
| WO | WO 02/01613 A3 | 1/2002 |
| WO | WO 02/32825 A1 | 4/2002 |
| WO | WO 02/101795 A3 | 12/2002 |
| WO | WO 03/014416 | 2/2003 |
| WO | WO 2004/030051 | 4/2004 |

OTHER PUBLICATIONS

J.A. Britten, "A moving-zone Marangoni drying process for critical cleaning and wet processing," Oct. 1997, *Solid State Technology*.

Owa et al. "*Immersion lithography; its potential performance and issues*", Proceedings of the SPIE, SPIE, Bellingham, VA, US, vol. 5040, No. 1, Feb. 28, 2003, pp. 724-733, XP002294500.

Lim et al., "*Atomic Layer deposition of transition metals*", Department of Chemistry and Chemical Biology, Harvard University, Nature Publishing Group, vol. 2, Nov. 2003, pp. 749-754.

ICKnowledge LLC, "*Technology Backgrounder: Atomic Layer Deposition*", ICKnowledge.com, 2004, pp. 1-7.

Machine generated English translation of JP08277486.

English Summary of JP05837190.

Machine generated English translation for JP11350169.

"*Chemical vapor deposition*", Wikipedia, the free encyclopedia, http://en.wikipedia.org/wiki/Chemical_vapor_deposition, 2005, p. 1-2.

Sigma-Aldrich, "*Atomic Layer Deposition (ALD)*", http://www.sigmaaldrich.com/Area_of_Interest/Chemistry/Materials_Science/Thin_Films, 2005, pp. 1-2.

U.S. Appl. No. 10/834,548, filed Apr. 28, 2004, Hemker et al.

\* cited by examiner

PROXIMITY SUBSTRATE PREPARATION SEQUENCE, AND METHOD, APPARATUS, AND SYSTEM FOR IMPLEMENTING THE SAME

CROSS-REFERENCE TO RELATED APPLICATIONS

This application is a continuation-in-part of U.S. application Ser. No. 10/816,432, filed on Mar. 31, 2004, now U.S. Pat. No. 7,045,018, and entitled "Substrate Brush Scrubbing and Proximity Cleaning-Drying Sequence Using Compatible Chemistries, and Method, Apparatus, and System for Implementing the same," from which priority under 35 U.S.C. §120 is claimed. This application is also a continuation-in-part of U.S. patent application Ser. No. 10/261,839, filed on Sep. 30, 2002, now U.S. Pat. No. 7,234,477, and entitled "METHOD AND APPARATUS FOR DRYING SEMICONDUCTOR WAFER SURFACES USING A PLURALITY OF INLETS AND OUTLETS HELD IN CLOSE PROXIMITY TO THE WAFER SURFACES," from which priority under 35 U.S.C. §120 is claimed. This application is also a continuation-in-part of U.S. patent application Ser. No. 10/404,270, filed on Mar. 31, 2003, now U.S. Pat. No. 7,069,937, and entitled "VERTICAL PROXIMITY PROCESSOR," which in turn is a continuation-in-part of U.S. patent application Ser. No. 10/261,839, filed on Sep. 30, 2002, now U.S. Pat. No. 7,234,477, and entitled "METHOD AND APPARATUS FOR DRYING SEMICONDUCTOR WAFER SURFACES USING A PLURALITY OF INLETS AND OUTLETS HELD IN CLOSE PROXIMITY TO THE WAFER SURFACES," from which priority under 35 U.S.C. §120 is claimed. The disclosures of these applications are incorporated herein by reference in their entirety.

BACKGROUND

1. Field of the Invention

The present invention relates generally to substrate preparation, cleaning, and drying and, more particularly, to systems, apparatus, and methods for improving semiconductor substrate preparation, cleaning, and/or drying by reducing preparation time and cost associated with substrate preparation operations.

2. Description of the Related Art

The fabrication of semiconductor devices involves numerous processing operations. These operations include, for example, dopant implants, gate oxide generation, inter-metal oxide depositions, metallization depositions, photolithography patterning, etching operations, chemical mechanical polishing (CMP), etc. As these operations generate particles and residues, substrate surfaces need to be cleaned so as to remove particulate contaminants adhered to the surfaces of the substrate.

Particulate contaminants generally consist of tiny bits of distinctly defined material having an affinity to adhere to the surfaces of the substrate. Examples of particulate contaminants can include organic and inorganic residues, such as silicon dust, silica, slurry residue, polymeric residue, metal flakes, atmospheric dust, plastic particles, and silicate particles, among others. Particulate contaminants should be removed from substrate surfaces as leaving behind such contaminants on substrate surface can have detrimental effects on the performance of integrated circuit devices.

Cleaning the substrate front sides (i.e., the active side or top surface) has traditionally been given a higher priority in typical substrate cleaning systems and processes because deleterious defects may be caused in the processing of the substrates. However, as substrate sizes have increased and/or feature sizes have decreased, certain shortcomings have been associated with the failure to adequately and properly clean and process substrate backsides (i.e., non-active side).

One drawback of having contaminant particulates on substrate backsides is migration of particulate contaminants from the substrate backside to the substrate front side. For example, the migration may occur during a wet processing step and/or as the substrate is being moved or otherwise handled between the processing or metrology tools. Furthermore, the backside contaminants can undesirably migrate from one process tools or steps thus contaminating subsequent processes.

To eliminate such drawbacks, in certain substrate processing operations, the substrate front side and backside are cleaned in a cleaning apparatus using chemicals. Thereafter, to produce a low defect level substrate, the substrate backside and front side are rinsed by, for example, De Ionized (DI) water. In this manner, the chemicals remaining on the substrate front side and backside are diluted and/or residual particulate contaminants thereon are displaced. Producing a substrate with low-defect level, however, can require that the substrate front side and backside be rinsed sufficiently. That is, the substrate front side and backside can be rinsed using a large amount of DI water for a specific period of time, which often, can be as long as the time spent to clean and/or process the substrate front side and backside. Of course, cleaning and/or processing the substrate surface may take an extended amount of time.

Additionally, in certain scenarios, certain conditions of the substrate front side (e.g., a portion of the device being expose, etc.) wherein rinsing the substrate front side may adversely affect the condition of the substrate surface. For instance, rinsing silicon substrate may result in re-growing of oxide on the exposed portions of the substrate surface while, in a copper substrate, rinsing the substrate front side and backside may result in corrosion.

In view of the foregoing, there is a need for a system, apparatus, and method for preparing substrate surfaces capable of substantially reducing the time and cost associated with processing the front side and backside of substrates.

SUMMARY OF THE INVENTION

Broadly speaking, the present invention fills these needs by providing a method, apparatus, and system for preparing substrate surfaces capable of substantially reducing time and cost associated with proximity preparing of substrate surfaces by eliminating the need to perform a rinse operation subsequent to a cleaning operation. It should be appreciated that the present invention can be implemented in numerous ways, including as a process, an apparatus, a system, a device, or a method. Several inventive embodiments of the present invention are described below.

In one embodiment, a method for preparing a surface of a substrate is provided. The method includes scanning the surface of the substrate by a meniscus, preparing the surface of the substrate using the meniscus, and performing a next preparation operation on the surface of the substrate that was prepared without performing a rinsing operation.

In another embodiment, a method for preparing a surface of a substrate is provided. The method includes applying a first meniscus onto the surface of the substrate so as to prepare the surface of the substrate and applying a second meniscus onto the surface of the substrate that was prepared so as to prepare the surface of the substrate that was prepared for a second time. Applying the second meniscus is configured to substantially directly follow applying of the first meniscus without performing a rinse operation.

In still another embodiment, a method for preparing a front surface and a back surface of a substrate is provided. The method includes forming a front meniscus with the front surface of the substrate and a back meniscus with the back surface of the substrate. The method further includes scanning the front surface of the substrate and the back surface of the substrate with the front meniscus and the back meniscus, respectively. Scanning the front surface of the substrate and the back surface of the substrate is configured to substantially clean and dry the front surface of the substrate and the back surface of the substrate. The method also includes performing a next substrate preparation process on the front surface of the substrate and the back surface of the substrate after the operation of scanning the front surface of the substrate and the back surface of the substrate without performing a rinsing operation.

The advantages of the present invention are numerous. Most notably, in contrast to the prior art, the embodiments of the present invention have eliminated the need to rinse substrate front side and backside every time the wafer front side and backside are exposed to chemicals. In this manner, the process time and cost associated with processing each substrate can be reduced significantly. Another advantage of the present invention is that preparing the wafer surfaces using the proximity substrate preparation system wafer surfaces can be prepared so that a state of wafer surfaces are remained substantially the same. For instance, wafer surfaces can remain clean for use in the next preparation stage without having to expose the wafer surfaces to water thus oxide regrowth on the semiconductor or wafer surfaces (e.g., metal surfaces) can be prevented.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION

Figure 1A:
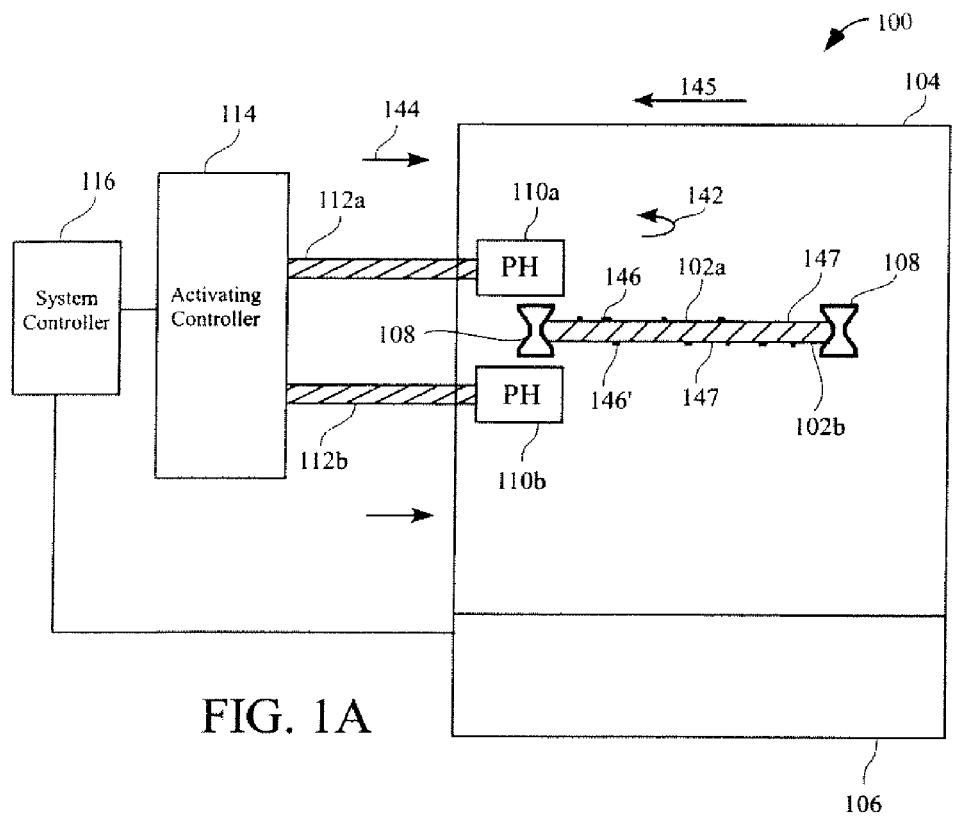
FIG. 1A is a simplified cross-sectional view of an exemplary proximity substrate preparation system, in accordance with one embodiment of the present invention.

An invention capable of substantially reducing cost and process time associated with preparing substrate surfaces by substantially eliminating a need to rinse substrate surfaces between substrate preparation operations is provided. In one embodiment, once a substrate surface is prepared by a proximity head using a meniscus that includes a chemistry, a next substrate preparation operation can be performed on the substrate surface without having to rinse the substrate surface. In one example, proximity preparation is cleaning and/or drying of the substrate surface, while in another embodiment, the proximity preparation is stripping of native oxide. According to yet another embodiment, the substrate surface can be proximity prepared by removing a layer formed over the substrate surface so as to intentionally generate precipitated residue using a first meniscus. Thereafter, the wafer substrate is proximity prepared using a second meniscus by causing a desired chemical reaction between a second chemistry of the second meniscus and the precipitated residue. Such subsequent substrate preparation operations are performed without having to rinse the substrate between the two proximity preparation operations. In one example, the first meniscus is utilized in one proximity head and the second meniscus is utilized in a second proximity head. In a different embodiment, the first meniscus and the second meniscus are utilized in a single proximity configured to traverse head traversing the entire wafer. In one implementation, the chemistry to prepare the wafer surface can be a solution of hydrofluoric acid (HF) and de-ionized water (DIW).

The meniscus, as disclosed in U.S. patent application Ser. No. 10/261,839, filed on Sep. 30, 2002, and entitled "METHOD AND APPARATUS FOR DRYING SEMICONDUCTOR WAFER SURFACES USING A PLURALITY OF INLETS AND OUTLETS HELD IN CLOSE PROXIMITY TO THE WAFER SURFACES," is incorporated herein by reference in its entirety.

In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

FIG. 1 is a simplified cross-sectional view of an exemplary proximity substrate preparation system 100, in accordance with one embodiment of the present invention. The system 100 includes a chamber 104, a plurality of rollers 108 defined therein, a fluid handling system 106, front and back proximity heads 110a and 110b, an actuating component 114, and a system controller 116. The chamber 104 is disposed over the fluid handling system 106 while the front and back proximity heads 110a and 110b are secured to the actuating component 114 by a front arm and a back arm 112a and 112b, respectively. In one embodiment, the actuating component 114 can be a motor.

Rollers 108 are configured to engage and rotate a wafer 102 in a rotation direction 142. In the embodiment illustrated in FIG. 1A, four rollers 108 are implemented two of which function as stabilizing members, and are configured to engage the wafer 102. The remaining two rollers 108 are configured to cause the wafer 102 to rotate in the rotation direction 142. When inserting the wafer, the two stabilizing rollers 108 are moved away and out of a path of the wafer 102, as the wafer to be processed 102 is delivered and inserted into the chamber 104. Thereafter, the stabilizing rollers 108 revert back so as to assume respective initial positions and to engage the wafer 102. Front and back proximity heads 110a and 110b are defined within the chamber 104 such that the Front and back proximity heads 110a and 110b border an edge of the wafer 102.

In the illustrated embodiment, chemistry implemented to clean the wafer backside 102b could encroach upon the wafer front side 102a. Contaminants 147 are shown to be disbursed over a wafer front side 102a and a wafer backside 102b. Liquid drops 146 and 146' are further disbursed over the wafer front side 102a and backside 102b, correspondingly. In one example, contaminants 147 and liquid drops 146 and 146' may have been generated during a preceding wafer preparation operation, which for instance, may be a brush scrubbing operation. Liquid drops 146, for instance, can be any liquid that may have remained on the wafer front side 102a subsequent to any of the previous wafer processing operations (e.g., chemical mechanical planarization (CMP), etching, etc.).

The fluid handling system 106 can be pulled out of the system 100 using for example, a slide mechanism. In one embodiment, the fluid handling system 106 includes two components, a drainage exhaust component and a flow-handling component. The flow-handling component is configured to include a plurality of flow controllers designed to contain raw chemistry to be used in preparing (e.g., cleaning, etc.) the wafer 102. The drainage/exhaust component includes a waste treatment unit designed to hold excess fluid, waste, residues, and contaminants being purged from the chamber 104. In one example, chemistries contained within the flow controller can be mixed at a manifold 125 to a proper concentration. In one example, raw chemistry implemented to clean the wafer surfaces can be the mixture of raw HF and DIW. According to one embodiment, computer software can be used by the system controller 116 to monitor and maintain the desired concentration for each of the chemistries. During the proximity substrate preparation process, same or different chemistries can be supplied to the front proximity head 110a and the back proximity head 110b through corresponding supply tubes. In this manner, additional chemistry can further be supplied (e.g., Isopropyl alcohol (IPA) vapor using $N_2$ as a carrier gas, etc.). As used herein, the portion of fluids (e.g., chemistry, IPA vapor, etc.) defined in the region between the front proximity head 110a and the wafer front side 102a is defined as the front meniscus 150. In the same manner, a back meniscus 152 is generated using the back cleaning chemistry, IPA vapor, etc.

Waste materials such as chemistries, contaminants, and liquids vacuumed from over the wafer front side 102a and wafer backside 102b are configured to be drained from front and back proximity heads 110a and 110b through tubes connected to waste outlets defined in front and back proximity heads 110a and 110b. Thereafter, the waste materials are delivered to the waste unit (e.g., collection vacuum tank) and are then purged from the collection tank to the facilities drain. Once front and back proximity heads 110a and 110b have concluded preparing (i.e., cleaning and/or drying) wafer front side and backside 102a and 102b, front and back proximity heads 110a and 110b are transported out of the chamber 104 using front and back arms 112a and 112b, respectively.

One of ordinary skill in the art must appreciate that while in one embodiment the actuating component can be a motor, in a different embodiment, the actuating component 114 can be any component capable of moving front and back arms 112a and 112b. Furthermore, it must be appreciated by one of ordinary skill in the art that different mechanics and engineering can be implemented to move front and back arms 112a and 112b and thus front and back proximity heads 110a and 110b into and out of the chamber 104.

In one example, when front proximity head 110a and back proximity head 110b are moved horizontally in the direction 144 so as to assume respective positions substantially at a center of the wafer 102, for example, the front proximity head 110a is moved vertically to a position in close proximity to wafer front side 102a and the back proximity head 110b is moved vertically to a position in close proximity to wafer backside 102b. One must appreciate that close proximity, as used herein, may be any suitable distance from wafer front side and backside 102a and 102b as long as corresponding front and back menisci 150 and 152 can be maintained with respect to wafer front side and backside 102a and 102b. In one embodiment, proximity heads 110a and 110b may each be moved to between about 0.1 mm to about 10 mm from wafer front side and backside 102a and 102b to initiate wafer processing operations, and preferably, between about 0.5 mm to about 4.5 mm from the wafer front side and backside 102a and 102b.

In the embodiment shown in FIG. 1A, while preparing the wafer front side and backside 102a and 102b, front and back proximity heads 110a and 110b move horizontally in the direction 145 along a radius of the wafer 102. However, it should be appreciated that front and back proximity heads 110a and 110b can be moved in any suitable manner with respect to the wafer 102 so as to prepare the wafer front side 102a and wafer backside 102b, as desired. By way of example, front and back proximity heads 110a and 110b can be moved from an edge of the wafer 102 to the center of the wafer. Furthermore, it must be noted that front and back proximity heads 110a and 110b may have any suitable size or shape as shown by, for example, in FIGS. 1E, 3B, 3D, 4A, and 4C. Yet further, one must appreciate that front and back proximity heads 110a and 110b can have numerous types of configurations capable of performing the processes described herein.

According to one implementation, as shown in FIG. 1A, front and back meniscus 150 and 152 traverse wafer front and backsides 102a and 102b so as to clean and/dry by exposing wafer surfaces to front and back chemistries. Thereafter, a next wafer preparation operation can be performed on wafer surfaces without having to rinse the wafer front side 102a or backside 102b with DI water. For instance, by applying front and back cleaning chemistries correspondingly to the wafer front side 102a and backside 102b, contaminants 147, 146, and 146' can be cleaned and removed from wafer front and back sides 102a and 102b, leaving substantially clean and/or dry wafer surfaces. In one embodiment, the rotation of the wafer 102 by rollers 108 serves to move a wafer area that has not been processed (e.g., cleaned and/or dried) into close proximity to front and back proximity heads 110a and 110b, leaving the wafer area moved to be processed substantially clean and dry.

In one example, HF can be used to clean the wafer front side 102a with the HF having the concentration of about 100:1. In another embodiment, the concentration of HF can be approximately about 1000:1. Of course, it must be noted that any chemistry suitable to remove contaminants 147, liquid drops 146, and 146' from wafer front side 102a and wafer backside 102b can be used so long as the chemistries selected for use in the module to prepare the wafer surfaces are selected such that the chemistries are chemically compatible (e.g., buffered Oxide Etch (BOE), HF and citric acid, HF and oxidizer ($H_2O_2$), standard clean 1 (SC1), standard clean 2 (SC2), ammonia, surfactants, acidic acid, citric acid, combinations of the acidic acid and citric acid, combination of the acidic acid, citric acid, and surfactants, ammonium fluoride, mixed copper clean (MCC) 2500, MCC3000, a mixture of sulfuric acid and hydrogen peroxide, etc.).

For additional information on MCC, reference can be made to: (1) U.S. Pat. No. 6,165,956, entitled "METHODS AND APPARATUS FOR CLEANING SEMICONDUCTOR SUBSTRATES AFTER POLISHING OF COPPER FILM," issued on Dec. 26, 2000; and (2) U.S. Pat. No. 6,593,282, entitled "METHODS AND APPARATUS FOR CLEANING SEMICONDUCTOR SUBSTRATES AFTER POLISHING OF COPPER FILM," issued on Jul. 15, 2003. These U.S. Patents are hereby incorporated by reference. For more information on wafer cleaning systems and techniques, reference may be made to commonly owned U.S. Pat. No. 5,858,109, issued on Jan. 12, 1999, entitled "METHOD AND APPARATUS FOR CLEANING OF SEMICONDUCTOR SUBSTRATES USING STANDARD CLEAN 1 (SC1)." For more information on wafer cleaning systems and techniques, reference may be made to the U.S. patent application Ser. No. 08/542,531, filed Oct. 13, 1995. These U.S. Patents and U.S. patent application are hereby incorporated by reference in their entirety.

In one example, the chemistries implemented can be any fluid having surface preparation properties (e.g., semi-aqueous solvents having mostly low surface tension, etc.). Furthermore, it should be appreciated, that depending on the embodiment, different front and back chemistries could be applied to wafer front side and backside 102a and 102b, respectively, depending on the application desired. Depending on the application, front and back cleaning chemistries may be the same type of chemistry having the same or different concentrations, or front and back chemistries can be different compatible chemistries.

One of ordinary skill in the art must appreciated that proximity preparation of wafer front side 102a and wafer back side 102b using the front and back proximity heads 110a and 110b can substantially be performed in the same manner. In the illustrated embodiment, the wafer surfaces are being cleaned and/dried such that substantially no precipitated residue can be detected, thus eliminating the need to rinse the wafer surfaces prior to proceeding to the next wafer preparation operation.

Figure 1B:
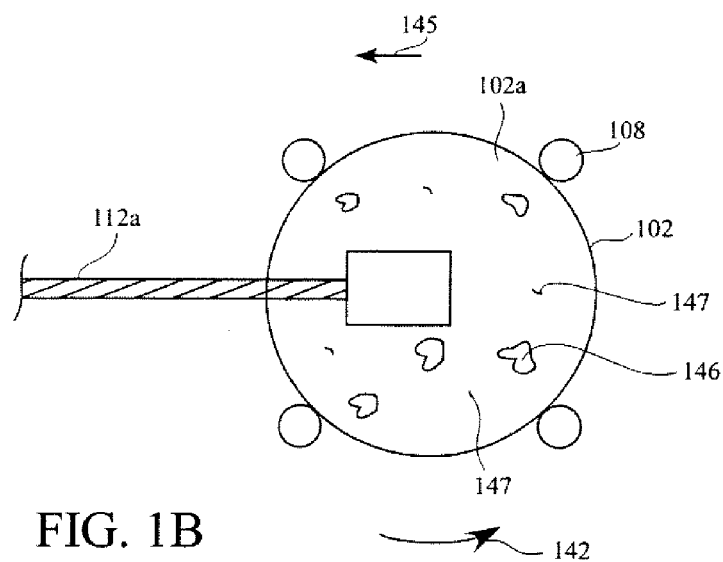
FIG. 1B is a simplified top view depicting the beginning of proximity preparation of the wafer front side in the proximity substrate preparation system of FIG. 1A, in accordance with another embodiment of the present invention.

Reference is made to FIG. 1B depicting a simplified top view depicting the beginning of the wafer front side 102a being cleaned and/or dried in the proximity substrate preparation system 100 of the present invention, in accordance with one embodiment of the present invention. The front proximity head 110a has been brought and held in close proximity to the wafer front side 102a by the front arm 112a and is being moved away from the center of the wafer front side in the direction 145 as the wafer 102 is being rotated in the rotation direction 142. The illustrated wafer front side 102a has contaminants 147 and liquid drops 146 spread thereon.

Figure 1C:
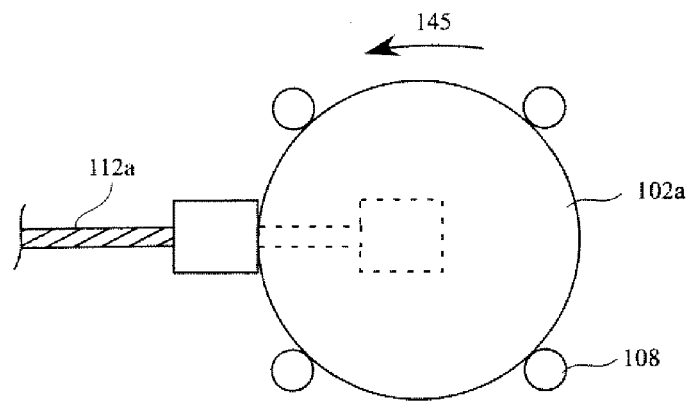
FIG. 1C is a simplified top view of the wafer front side shown in FIG. 1B substantially at the conclusion of the cleaning/drying operation, in accordance with yet another embodiment of the present invention.

FIG. 1C is a simplified top view of the wafer front side 102a shown in FIG. 1B substantially at the conclusion of the cleaning and/or drying operation by the front proximity head 110a, in accordance with one embodiment of the present invention. As shown, while the front proximity head 110a moves in the direction 145, the wafer front side 102a is cleaned by the front proximity head 110a creating a clean and dry wafer front side 102a expanding from the center of the wafer 102 to the edge of the wafer 102. Specifically, contaminants 147 have been cleaned and dried by the front proximity head 110a leaving a substantially dry wafer front side 102a. Thus, the proximity cleaning and/or drying of the wafer front side 102a and backside 102b using the proximity preparation system of the present invention results in clean and dry wafer front side 102a and backside 102b such that the next preparation step can be performed on the wafer 102 surfaces without having to first rinse the wafer surfaces in a rinse operation.

In one exemplary operation, front and back proximity heads 110a and 110b remove contaminants, fluids, and etch thin film from wafer front side and backside 102a and 102b using front and back menisci 150a and 150b, respectively. Specifically, isopropyl alcohol (IPA) and front cleaning chemistry are applied to and evacuated from wafer front side 102a, while IPA and back cleaning chemistry are applied to and evacuated from the wafer backside 102b. As can be appreciated, the rotation of rollers 108 causes the wafer 102 to rotate, thus allowing substantially entire wafer front side and backside 102a and 102b be cleaned and/or dried. In this manner, the process time as well as cost associated with rinsing the wafer surfaces prior to proceeding to the next preparation stage is substantially eliminated.

Although in the embodiment shown in FIG. 1C the front proximity head 110a moves in the direction 145, from the wafer center to the wafer edge, it must be noted that any suitable cleaning and drying path may be generated by changing the configuration of the system 100, the orientation of proximity heads, or movement of proximity heads. It must further be appreciated that the wafer 102 may be engaged in any suitable orientation as long as the orientation enables front and back proximity heads 110a and 110b to be in close proximity to a portion of corresponding wafer front side and backside 102a and 102b to be cleaned or dried.

Figure 1D:
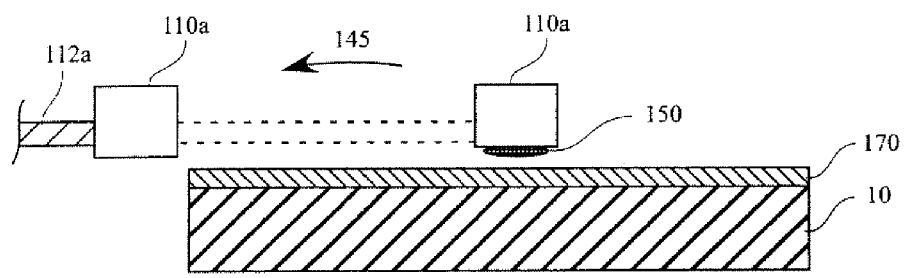
FIG. 1D is a simplified cross-sectional view of the wafer front side having been cleaned and/or dried by the front proximity head shown in FIG. 1C, in accordance with yet another embodiment of the present invention.

The wafer front side 102a having been cleaned and/or dried by the front proximity head 110a shown in FIG. 1C is illustrated in the simplified cross-sectional view of FIG. 1D, in accordance with one embodiment of the present invention. In the illustrated embodiment, the wafer front side 102a, which has been cleaned and/or dried by the front proximity head 110a, visibly, does not have any contaminants 147 and liquid drops 146 thereon. In one example, the portion of the wafer front side 102a defined ahead of the leading edge of the front proximity head 110a can be partially covered by contaminants 147 and liquid drops 146 prior to the cleaning and/or drying. However, as the proximity preparation continues, the trailing edges of front proximity head 110a are configured to leave behind clean and dry substrate surfaces. As used herein, a leading edge of a proximity head is defined as the area between the proximity head and the wafer surface defined in front of the meniscus. In a like manner, the trailing edge of the proximity head is the area between the proximity head and the wafer surface defined at the back of the meniscus.

In one exemplary embodiment, proximity cleaning and/or drying of the wafer front side 102a can be described as follows: A front cleaning chemistry inflow and the IPA inflow are applied onto the wafer front side 102a. In this manner, any fluid remaining on the wafer front side 102a is intermixed with the front cleaning chemistry inflow. At this time, front cleaning chemistry and DIW inflows, as applied onto the wafer front side 102a, encounter the IPA inflow. As a result, the applied front cleaning chemistry and DIW inflows reside in the region between the front proximity head 110a and the wafer front side 102a along with the liquid drops 146 (in certain embodiment, liquid film 146) and back chemistry droplets 1211, forming the front meniscus 150. Therefore, front and back menisci 150 and 152 are configured to be constant flows of fluid being applied toward the corresponding wafer front side 102a and wafer backside 102b and can be removed along liquid drops 146 and back chemistry droplets 1211 on the wafer front side 102a at substantially the same time. According to one embodiment of the present invention, once the front proximity head 110a is moved in close proximity to the wafer front side 102a, front chemistry, and IPA inflows are introduced into the front proximity head 110a so as to generate the front meniscus 150 that is in contact with the wafer front side 102a. Almost simultaneously, liquid drops 146 and contaminants 147 are vacuumed and removed from over the wafer front side 102a.

Accordingly, as the front proximity head 110a scans the wafer front side 102a, the front meniscus 150 moves along with the front proximity head 10a. In this manner, the region of the wafer front side 102a previously occupied by the front meniscus 150 is cleaned and dried as a result of the movement of the front meniscus 150 as applying the meniscus and removal of fluid is achieved substantially simultaneously. Thus, beneficially, the wafer front side 102a can be exposed to chemistry so as to be cleaned and/or be dried in the proximity cleaning and/or drying system of the present invention so as to produce a clean and/or dried wafer surface thus eliminating the need to the rinse the wafer front side 102a in a rinse operation.

In a like manner, although not shown, the wafer backside 102b can be cleaned and dried in the proximity cleaning and drying system of the present invention without having to rinse the wafer backside 102b with DI water prior to performing the next preparation operation on the wafer backside 102b. In one embodiment, a diluted HF inflow, DIW inflow, and IPA vapor inflow can be applied onto the wafer backside 102b forming the back meniscus 152. In such embodiment, a waste outlet may be utilized to apply vacuum to the region in close proximity to the wafer backside 102b so as to remove any fluid, contaminants, or vapor that may be located on or near the backside 102b.

According to one embodiment, as illustrated in FIG. 1D, it is believed that an analysis of wafer front side or backside 102a and 102b may reveal the existence of precipitated residue (e.g., fluorine ions generated as a result of exposure to aqueous HF) on wafer front side and backside 102a and 102b, if leaving the precipitated residue is intentional. That is, it is believed that the portion of the wafer front side 102a and the portion of the wafer backside 102b previously occupied by front and back meniscus 150 and 152 may include precipitated residue, if so selected. Nonetheless, substantially no liquid may be present. As will be described in more detail below, precipitated residue can be generated as a result of removing contaminants and fluid from wafer front side 102a and wafer backside 102b, or if selected a layer formed over the wafer surface, entering into a chemical reaction with the front cleaning chemistry or back cleaning chemistry being used to clean and/or dry wafer front and backsides 102a and 102b. Thus, the embodiments of the present invention are designed to leave the wafer front side and backside 102a and 102b clean and dry subsequent to being cleaned and dried using the front or back cleaning chemistry inflows and IPA inflows, if so selected, or precipitated residue can be intentionally generated so as to remain on the wafer front side and backside for use during the next preparation operation.

Figure 1E:
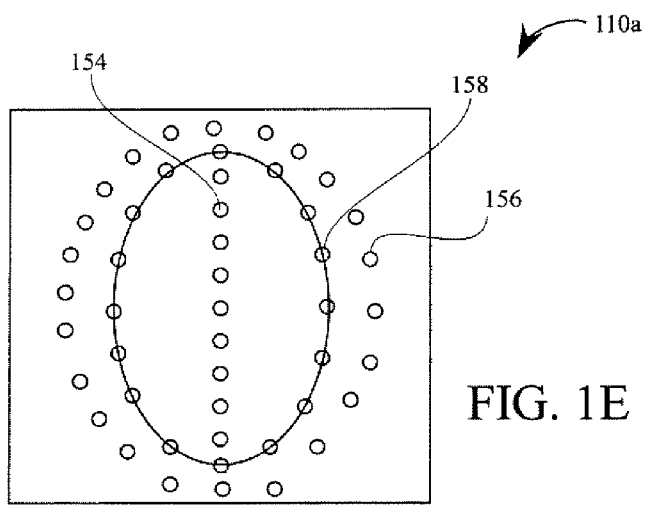
FIG. 1E is a simplified bottom view of an exemplary front proximity head, in accordance with yet another embodiment of the present invention.

FIG. 1E is a bottom view of an exemplary front proximity head 110a, in accordance with one embodiment of the present invention. The depicted front proximity head 110a has an oblong shape having a plurality of outlets and inlets. The plurality of outlets is designed to introduce different types of fluid onto the wafer front side 102a while a plurality of vacuum inlets are configured to be used to almost simultaneously vacuum fluid and contaminants from over the wafer front side 102a so as to clean and dry wafer front side 102a without rinsing the wafer front side with DI water. The plurality of chemistry inlets 154 are defined substantially in the middle of the front proximity head 110a forming a substantially linear line designed to introduce front chemistry inflow onto the wafer front side 102a. Bordering the front chemistry inlets 154 is a plurality of vacuum inlets 158 designed to vacuum and eliminate contaminants and any type of fluid defined between the vacuum inlets 158 and the wafer front side 102a. As can further be seen, a plurality of isopropyl alcohol (IPA) inlets 156 are defined bordering the vacuum inlets 158, which in the embodiment shown in FIG. 1E, define an elliptic path. In the illustrated embodiment, the front meniscus 150 is formed in an area confined within the elliptical path of the vacuum inlets 158.

One of ordinary skill in the art must appreciate that the IPA inflow may be in any suitable form such as, for example, IPA vapor where IPA in vapor form is inputted through use of a $N_2$ gas. In a like manner, although several embodiments of the present invention have been described as using DIW, in another embodiment, any other suitable fluid may be utilized that may enable or enhance the wafer processing such as, for example, water purified in other ways, cleaning fluids, etc. Yet further, it should be appreciated that the size as well as the locations of the inlets and outlets may be varied on front and back proximity heads so long as front and back menisci are stable.

In accordance with one embodiment of the present invention, when using a front cleaning chemistry and a back cleaning chemistry, the front cleaning chemistry and back chemistries can be a solution of HF and DIW. Depending on the type of application, however, a concentration of HF in the front chemistry and back chemistry may be equivalent or vary. According to one implementation, the concentration of HF in the back chemistry can range between approximately 10:1 and 1500:1, and more preferably between approximately 2:1 and 1000:1, and most preferably approximately 50:1. Likewise, the concentration of HF in the front chemistry can range between approximately 50:1 and 10,000:1, and more preferably between approximately 100:1 and 1000:1.

Figure 2A:
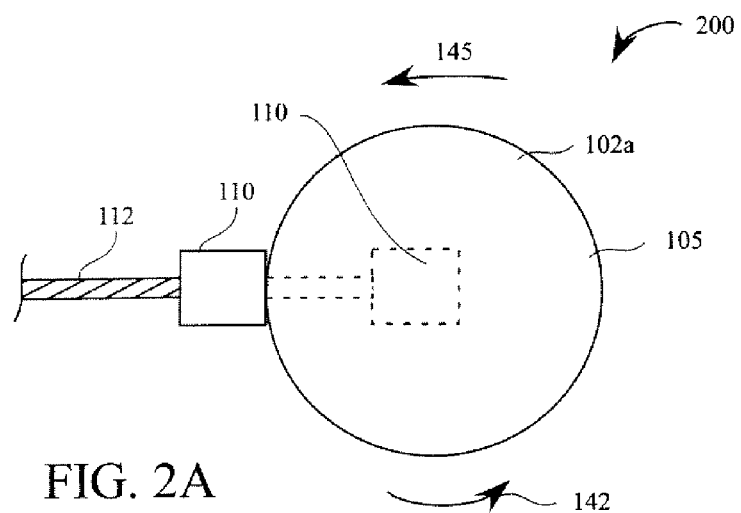
FIG. 2A is a simplified top view of a proximity head preparing the wafer front side, in accordance with yet another embodiment of the present invention.

Reference is made to a simplified top view shown in FIG. 2A depicting a proximity head 110 of the present invention preparing the wafer front side 102a for a subsequent operation, in accordance with one embodiment of the present invention. During the illustrated preparation operation, the proximity head 110 is being moved in the direction 145, from the center of the wafer 102 to the edge of the wafer 102, as the wafer 102 is being rotated in the direction 142. As shown, a native oxide layer 105 defined over the wafer front side 102a is being stripped as the meniscus 150' is being applied onto the native oxide layer 105. In one example, the native oxide layer 105 having a thickness of approximately 12 angstroms can be stripped by the proximity head 110 of the present invention by applying the meniscus 150' including HF having a concentration of approximately 6:1. In such an example, the meniscus 150' is applied onto the native oxide layer 105 such that the native oxide is removed as the HF defined substantially in the center of the meniscus 150' is being applied on the native oxide layer 105. Almost, at the same time, the native oxide layer 105, as stripped, as well as the HF are removed from over the wafer surface, by vacuum inlets defined in the proximity head 110, leaving the wafer front side 102a stripped of the native oxide layer 105 and substantially dry. In this manner, the native oxide layer 105 can be stripped from over wafer surfaces and be subsequently prepared using a different preparation operation, without having to rinse the wafer front side 102a in a rinse operation, thus eliminating the cost as well as process time associated with rinsing the wafer front side 102a.

By way of example, the wafer front side 102a, as stripped, can be substantially free of contaminants and excess liquid thus allowing the next preparation operation (e.g., etch, storage, etc.) to be performed without having to first rinse the wafer surfaces. In a different embodiment, a layer (e.g., a monolayer) of protective film (e.g., BTA) can be left behind on the wafer surfaces so as to protect copper from possibly corroding in moist air. Accordingly, the embodiments of the present invention enable the use of very concentrated chemistry to remove, clean, and/or dry wafer surfaces without having a need to rinse the wafer surfaces thereafter before performing the next substrate preparation operation.

Figure 2B:
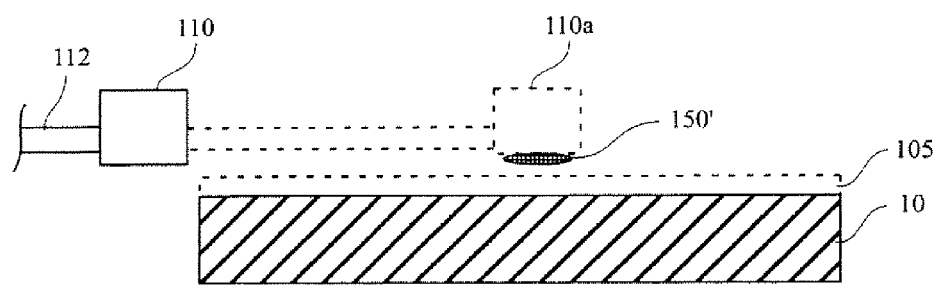
FIG. 2B is a simplified cross-sectional view of the wafer front side being prepared as shown in FIG. 2A, in accordance with still another embodiment of the present invention.

Stripping the native oxide layer 105 so as to create the stripped wafer front side 102a is shown in the simplified cross-sectional view of FIG. 2B depicting the wafer front side 102a as shown in FIG. 2A, in accordance with one embodiment of the present invention. As can be seen, the native oxide layer 105 as marked by the dotted line, has been removed as a result of the proximity head 110 and thus the meniscus 150' traversing from the center of the wafer front side 102a to the edge of the wafer front side 102b. In one embodiment, as the solution of HF strips the native oxide layer 105, all generated liquids and particulates are removed by the vacuum inlets defined in the proximity head 110. In this manner, the native oxide layer is stripped after being prepared by the proximity head using chemicals such that substantially all contaminants and liquids are removed from the wafer front side, leaving a stripped, cleaned, and/or dry wafer front side 102a. In this manner, the next wafer preparation operation can be performed without having to first rinse the wafer front side 102a.

Figure 3A:
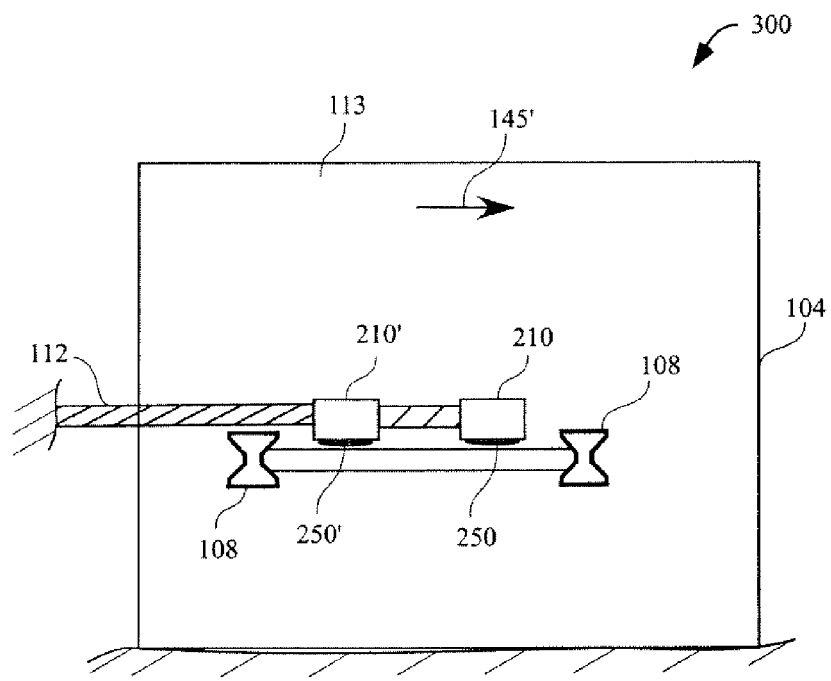
FIG. 3A is a simplified cross sectional view of an exemplary sequential proximity preparation system implementing a pair of parallel bar-type proximity heads, in accordance with still another embodiment of the present invention.

According to yet another embodiment, a sequential proximity preparation system can be implemented to prepare the wafer surfaces such that wafer surfaces can exhibit a different property. FIG. 3A is simplified cross sectional view of an exemplary sequential proximity preparation system 300 implementing two parallel bar-type proximity heads 210a and 210a' to sequentially prepare the wafer front side 102a, in accordance with one embodiment of the present invention. A first proximity head 210a is secured to a second proximity head 210' via a connection arm 113 while the second proximity head 210' is secured to the actuating component via the arm 112. In operation, the first proximity head 210 and the second proximity head 210', and thus the associated first and second menisci 250 and 250' are applied to the wafer front side 102a and are moved in the direction 144. In this embodiment, the wafer 102 is configured not to rotate as the entire surfaces of the wafer 102 is being traversed, and thus processed. As is described in more detail below, in one embodiment, the sequential proximity preparation of the wafer front side 102a can be performed in the scale of an entire wafer front side, as shown in FIG. 3B.

Figure 3B:
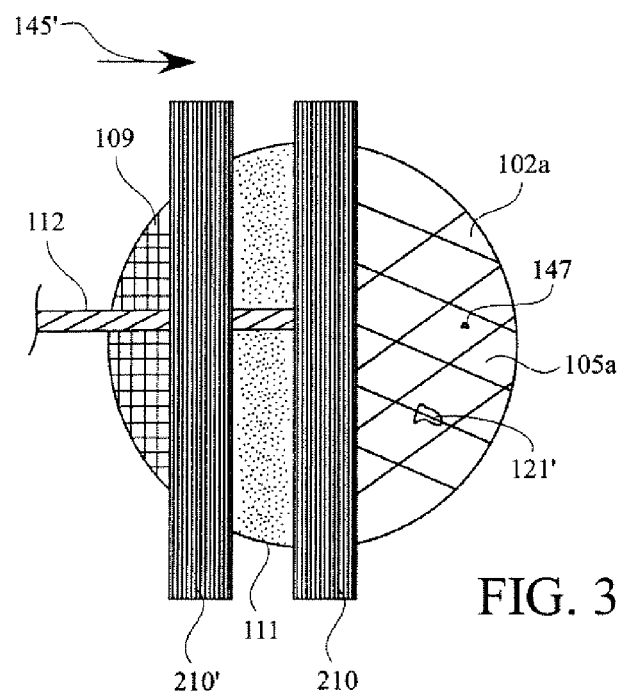
FIG. 3B is a simplified top view of wafer front side being prepared by the two bar-type proximity heads shown in FIG. 3A, in accordance with still another embodiment of the present invention.

In one exemplary embodiment, the wafer front side 102a can be chemically processed in two sequential processes, as shown in the simplified top view in FIG. 3B, in accordance with one embodiment of the present invention. As can be seen, almost three different sections can be visually depicted on the wafer front side 102a. The section 105a is the oxide layer 105 initially formed over the wafer front side 102a and defined ahead of the leading edge of the first front proximity head 210, precipitated residue 111 generated as a result of exposing the oxide layer 105 to the first meniscus 250, and a desired layer 109 formed as a result of chemical reaction between the precipitated residue 111 and the second meniscus 250'. Of course, it must be noted that depending on a type of wafer preparation operation desired, the precipitated residue 111 can be configured to cover the wafer front side 102a continuously, and thus be in the form of a film.

According to one embodiment of the present invention, sequentially preparing the wafer front side 102a using the two bar-type proximity heads 210 and 210' can be achieved as described below. Initially, the leading edge of the first proximity head 210 is brought in close proximity to the wafer front side 102a as the arm 112 is moved in the direction 145'. At this point, the first meniscus 250 generated by the first chemistry and IPA inflow is brought into contact with the oxide layer 105 as defined at the edge of the wafer front side 102a. As a result of a desired chemical reaction between the oxide and the first meniscus 250, precipitated residue 111 is generated, almost covering the entire portion of the oxide layer 105 that has come into contact with the first meniscus 250. Substantially simultaneous with the formation of the precipitated residue 111, any liquid generated as a result of the chemical reaction or remaining on the wafer front side 102a from a previous wafer preparation process is vacuumed and removed from that specific portion of the wafer front side 102a.

While the first proximity head 210 and thus the first meniscus 250 is being applied onto the wafer front side 102a and is being moved in the direction 145', the second proximity head 210b and thus the second meniscus 250' trailing the first proximity head 210 and first meniscus 250 is applied onto the wafer front side 102a, and more particularly, on that portion of the wafer surface 102a processed immediately before by the first proximity head 210 resulting in the formation of the precipitated residue 111. At this point, the second chemistry and IPA inflows of the second meniscus 250' chemically reacts with the precipitated residue 111 so as to generate the desired layer 109 over that portion of the wafer front side 102a previously prepared by both, the first proximity head 210 and the second proximity head 210'. In accordance with one embodiment, the first and second proximity heads 210 and 210' can be defined in close proximity to one another such that the desired layer 109 is formed substantially directly after the precipitated residue 111 is generated.

Figure 3C:
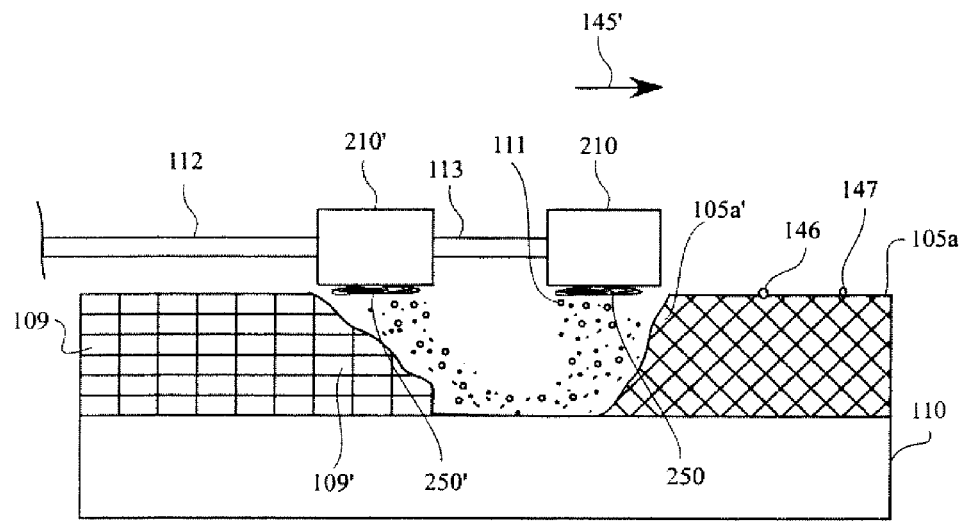
FIG. 3C is a simplified cross-sectional view of the wafer front side illustrated in FIG. 3B as the wafer surface is being prepared by the two-bar proximity head, in accordance with still another embodiment of the present invention.

Chemically removing the oxide layer 105 so as to intentionally generate the desired precipitated residue 111 and subsequent chemical reactions so as to form the desired layer 109 can further be understood with respect to the simplified enlarged cross section view shown in FIG. 3C, in accordance with one embodiment of the present invention. The portions of the oxide layer 105 being chemically treated by the first meniscus 250 of the first proximity head 210 is being modified such that precipitated residue 111 if formed. As can be seen, portions of the oxide layer 105a already treated by the first meniscus 250 have been chemically transformed, at least partially. However, the area directly beneath the first proximity head 250 not completely covered by the first meniscus 250 is being changed as the first front meniscus 250 is moved across the wafer front side 102a.

Analogously, the portions of the precipitated residue 111 previously treated by the second meniscus 250' is currently covered by the desired layer 109 whereas the portions of the precipitated residue 111 just being treated by the second meniscus 250' has not yet fully been transformed to the desired layer 109. Thus, beneficially, as the first proximity head 210 and second proximity head 210' are moved across the wafer front side 102a, a layer formed over the wafer front side 102a can be removed by chemically exposing the layer to a first chemistry. Thereafter, the layer removed can be replaced by a desired layer without the need to rinse the wafer front side with rinse chemistry after the removing of the formed layer and prior to forming the desired layer.

Figure 3D:
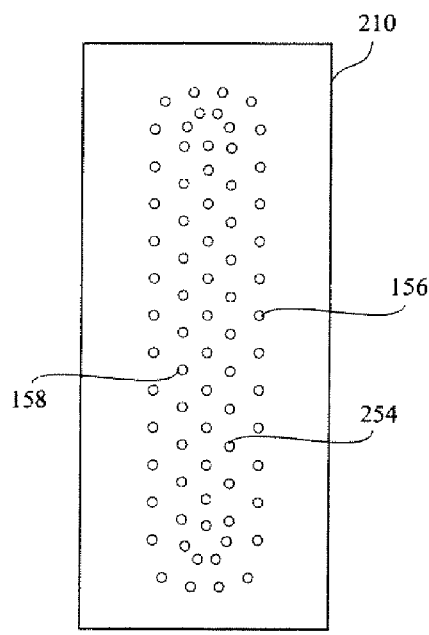
FIG. 3D is a simplified top view of an exemplary proximity bar, in accordance with still another embodiment of the present invention.

FIG. 3D is a bottom view of an exemplary sequential substrate preparation system including a single meniscus, in accordance with one embodiment of the present invention. As can be seen, a plurality of vacuum outlets 158 is defined adjacent to the first chemistry inlets 254, while a plurality of IPA vapor inlet 156 is defined adjacent to the vacuum outlets 158. The outlets and inlets are substantially uniformly spread over the bottom surface of the first proximity head 210a so that the removal of the formed layer and formation of the desired layer can be achieved in a substantially uniform fashion. In this manner, the first proximity head 210a can be implemented to prepare the entire wafer front side 102a such that a substantially homogenous wafer front side 102a can be created. In one example, sequential proximity preparation processes can be removing an oxide layer followed by a passivation operation, a plating operation, re-growth of native oxide, etc. By way of example, the wafer front side can be passivated and an oxide layer formed over the wafer surface so as to store the wafer in storage. In such an example, rinsing the wafer front side 102a subsequent to being passivated is undesirable, as rinsing the passivated layer can nullify the passivation operation. In one exemplary embodiment, surfactants, polymers, benzene trizol (BTA) are chemistries that can be implemented to passivate a wafer front side layer. Yet another example is plating a wafer front side by removing of a layer formed over the wafer surfaces and forming a desired layer instead. For instance, an oxide layer is removed and thereafter the seed layer is applied through a type of chemical processing. In accordance with one embodiment, removal of the formed layer and replacement of the layer by a desired layer is configured to be performed in an inert atmosphere. In one example, such results can be achieved by using nitrogen and not exposing the wafer surfaces to oxygen by for instance, using a closed chamber. For additional information about a closed chamber capable of providing an inert atmosphere, reference is made to U.S. patent application Ser. No. 10/817, 398 filed on Apr. 1, 2004 entitled "CONTROLS OF AMBIENT ENVIRONMENT DURING WAFER DRYING USING PROXIMITY HEAD," This U.S. patent applications is hereby incorporated by reference.

This is achieved by using nitrogen as the inert gas between different strips of menisci. In one example, sequential removal and formation of layers on wafer front side can be achieved by using dilute chemicals to achieve the layer removal as well as the formation of the layer. Thereafter, the wafer front side can be processed in the next preparation stage, which in one example, can be deposition, etch, passivation, storage, etc.

Although in the embodiment shown in FIGS. 3A-3D first and second proximity heads have been implemented, in a different embodiment, multiple proximity heads can be implemented so long as the operations of removing of a layer, generating precipitated residue, and forming of the desired layer can be achieved.

Figure 4A:
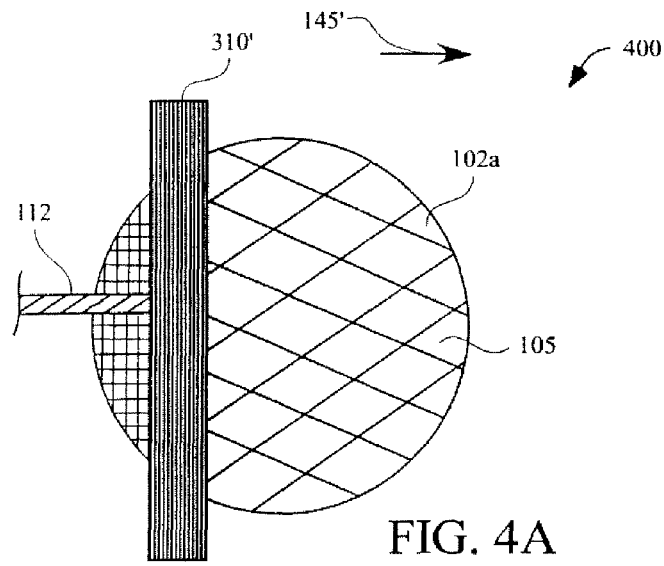
FIG. 4A is a simplified top view of a sequential proximity preparation system implementing a single bar-type proximity head, in accordance with still another embodiment of the present invention.

Proceeding to FIG. 4A, removal of a layer, generation of precipitated residue, and formation of the desired layer using a two-menisci single bar-type proximity head is illustrated in accordance with one embodiment of the present invention. The leading edge of the proximity head 310 is brought in close proximity to the wafer front side 102a covered by the oxide layer 105 as the front arm 112 is moved in the direction 145'. At this point, first, the front meniscus 250 generated by the first chemistry and IPA inflows and thereafter, the second meniscus 250' generated by the second front chemistry and IPA inflows are brought in contact with the oxide layer 105. As a result of the desired chemical reaction between the oxide 105 and the first front meniscus 250, precipitated residue 111 is generated, almost covering the portion of the wafer that was in contact with the first front meniscus 250. At this moment, any liquid generated as a result of the chemical reaction of the first meniscus 250 and the oxide layer 105 or remaining on the wafer front side 102a from a previous wafer preparation process is vacuumed and removed from over the wafer front side 102a. In one example, this is achieved almost concurrent with the formation of the precipitated residue 111.

However, as shown, the second meniscus 250' is trailing the first meniscus 250 and as such, is being applied onto the wafer front side 102a, and more particularly, onto the precipitated residue 111. At this point, the second chemistry and IPA inflows of the second meniscus 250' chemically react with the precipitated residue 111 so as to generate the desired layer 109 over the prepared portion of the wafer front side 102a. In accordance with one embodiment, the desired layer 109 can be formed substantially immediately after the precipitated residue 111 is generated.

Figure 4B:
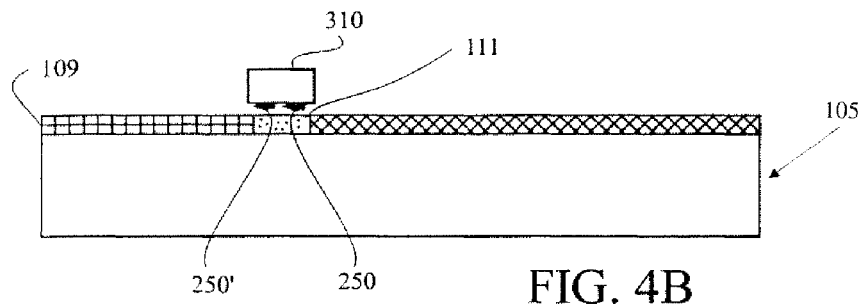
FIG. 4B a simplified cross sectional view of the wafer front side being prepared by the single bar-type proximity head shown in FIG. 1A, in accordance with still another embodiment of the present invention.

FIG. 4B is a simplified cross-sectional view of the wafer 102 being sequentially prepared in FIG. 4A, in accordance with one embodiment of the present invention. As illustrated, the portions of the oxide layer 105 being chemically treated by the first meniscus 250 are being modified that the precipitated residue 111 can be generated. As can be seen, portions of the oxide layer 105a being treated by the first front meniscus 250 has been chemically transformed, at least partially. However, the area under the first proximity head 250 not covered by the first front meniscus 250 is to be changed as the first front meniscus 250 is moved across the wafer front side 102a.

Comparatively, the portions of the precipitated residue 111 previously treated by the second meniscus 250' is currently covered by the desired layer 109 whereas the portions of the precipitated residue 111 just being treated by the second meniscus 250' has not yet fully been transformed to the desired layer 109. Thus, beneficially, as the front proximity head 210 is traversing the wafer front side 102a, a layer formed over the wafer front side 102a can be removed and thereafter substantially instantaneously be replaced by a desired layer without first rinsing the wafer front side with a rinse chemistry.

Figure 4C:
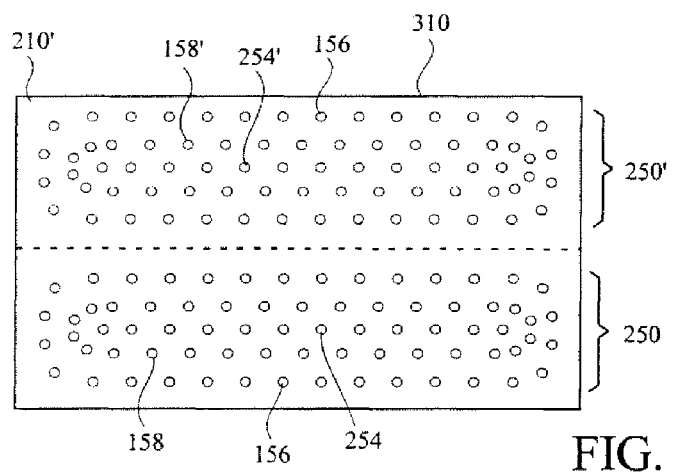
FIG. 4C is a simplified bottom view of an exemplary single bar-type proximity head including two menisci, in accordance with still another embodiment of the present invention.

FIG. 4C is a bottom view of an exemplary double menisci bar-type proximity head 310, in accordance with one embodiment of the present invention. As can be seen, a plurality of vacuum outlets 158 is defined adjacent to the first chemistry inlets 254, while a plurality of IPA vapor inlet 156 is defined adjacent to the vacuum outlets 158. In the same manner, a plurality of vacuum outlets 158 is defined adjacent to the second chemistry inlets 254', while a plurality of IPA vapor inlets 156 is defined adjacent to the vacuum outlets 158. The outlets and inlets are also substantially uniformly spread over the bottom surface of the proximity head 310 so that the removal of the formed layer and formation of the desired layer can be achieved in a substantially uniform fashion. In this manner, the proximity head 310 can be implemented to prepare the entire wafer front side 102a such that a substantially homogenous wafer front side 102a can be created.

It must be noted that although in the illustrated embodiments the proximity heads of present invention include a plurality of front or back chemistry inlets 154, 154', 254, and 254', vacuum outlets 158 and 158', and IPA vapor inlet 156, in another embodiment, the embodiments of the present invention may implement at least one front chemistry inlet, one back chemistry inlet, at least one IPA vapor inlet 156, and at least one vacuum outlet 158. It must be noted by one of ordinary skill in the art that other types of orientations such as IPA-DIW-vacuum, DIW-vacuum-IPA, vacuum-IPA-DIW, etc. may be utilized depending on the wafer preparation processes desired and type of wafer cleaning and/or drying mechanism being enhanced.

In one preferred embodiment, the IPA-vacuum-DIW orientation is used to intelligently and powerfully generate, control, and move the menisci located between the proximity heads and the wafer surfaces. In another embodiment, IPA-vacuum orientation can be used to clean and/or dry wafer front and backsides 102a and 102b. For example, in addition to the front chemistry inlet, IPA vapor inlet, the vacuum outlet, and the DIW inlet, in an additional embodiment, there may be additional sets of IPA vapor outlets, DIW inlets and/or vacuum outlets depending on the configuration of the proximity head desired. Yet further, it should be appreciated that front and back proximity heads can have any number and type of inlets and outlets and that inlets and outlets may be oriented on front and back proximity heads in any appropriate orientation. Still further, front and back menisci can be managed in any suitable manner by controlling the amount of flow of fluids onto wafer front and backsides and by controlling the vacuum applied.

Figure 5:
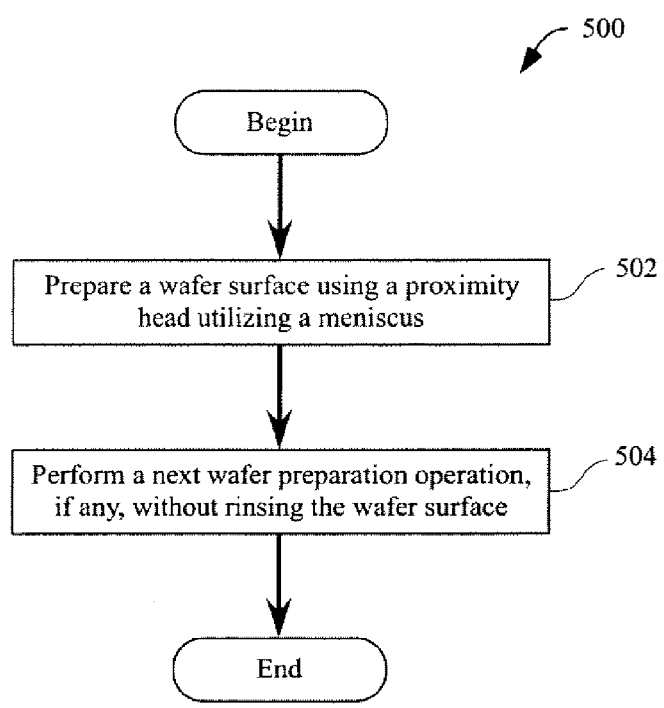
FIG. 5 is a flowchart diagram depicting method operations performed in an exemplary proximity wafer preparation system, in accordance with still another embodiment of the present invention.

Reference is made to a flowchart diagram 500 shown in FIG. 5 depicting method operations performed in an exemplary proximity wafer preparation system, in accordance with one embodiment of the present invention. The method begins in operation 502 in which a wafer surface is prepared using a proximity head utilizing a meniscus. In one example, the wafer preparation operation is configured to clean and/or dry the wafer surface. Thereafter, in operation 504, the next wafer preparation operation is performed on the wafer surface without rinsing the wafer surface with rinse fluid. In this manner, for instance, DIW normally used to rinse wafer surface after the wafer surface has been exposed to chemicals is eliminated thus reducing the wafer process time as well as the cost associated with preparing the wafer surface.

Figure 6:
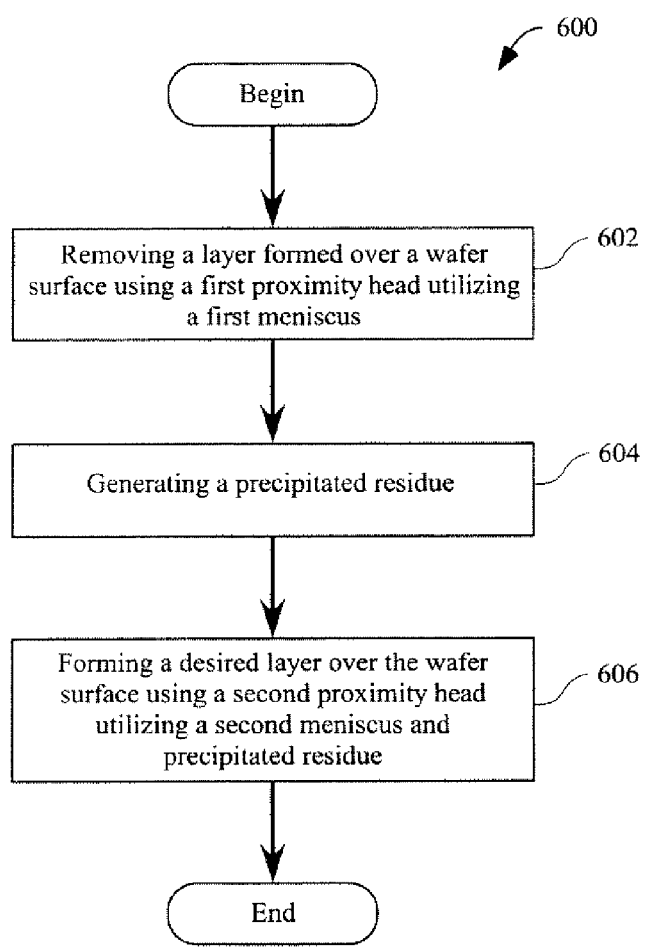
FIG. 6 is a flowchart diagram depicting method operations performed in a sequential proximity preparation system using two bar-type proximity heads, in accordance with one embodiment of the present invention.

Continuing to the flowchart diagram shown in FIG. 6, method operations performed in a sequential two bar-type proximity head preparation system can further be understood, according to one embodiment of the present invention. In operation 602, a layer formed over the wafer surface is removed by a first proximity head utilizing a first meniscus. In one example, the layer being removed is an oxide layer. Next, in operation 604, precipitated residue is formed intentionally as a result of a desired chemical reaction between a first chemistry in the first meniscus and the layer being removed. Thereafter, in operation 606, a desired layer is formed over the wafer surface using the second proximity head and second meniscus and the precipitated residue. In one example, a desired chemical reaction is achieved between a second chemistry of the second meniscus and the precipitated residue, forming the desired layer.

Figure 7:
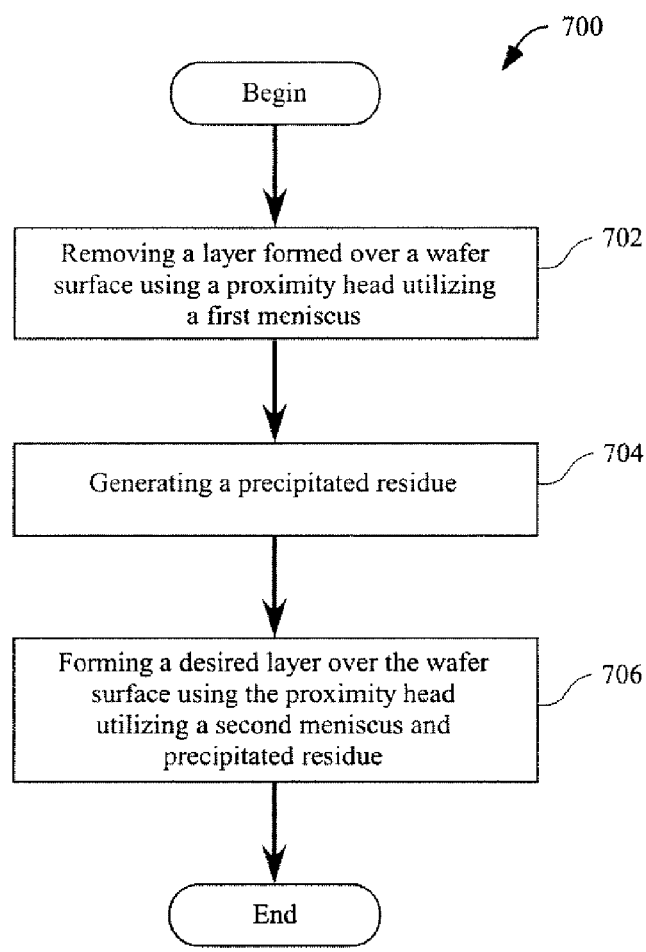
FIG. 7 is a flowchart diagram depicting method operations performed in a sequential proximity preparation system implementing a single bar-type proximity head including two menisci, in accordance with still another embodiment of the present invention.

Reference is made to a flowchart diagram shown in FIG. 7, depicting method operations performed during a sequential single bar-type proximity wafer preparation system including two menisci, in accordance with one embodiment of the present invention. In operation 702, a layer formed over the wafer surface is removed using a first meniscus of the proximity head followed by generating precipitated residue in operation 704. Precipitated residue is generated as a result of a desired chemical reaction between the formed layer and a first chemistry of the first meniscus. Next, in operation 706, a desired layer is formed over the wafer surface using the proximity head utilizing a second meniscus of the proximity head and the precipitated residue. In one embodiment, the second meniscus trails the first meniscus, thus almost immediately covering an area of the wafer prepared by the first meniscus previously.

According to one embodiment of the present invention, the brush proximity wafer preparation system of the present invention can be incorporated in a clustered wafer processing system. For instance, after a wafer front side and/or backside has been pre-processed in an etching chamber, a chemical vapor deposition system, a chemical mechanical polishing (CMP) system, etc., the wafer front side and back side can be prepared in the system of the present invention. Thereafter, without having to rinse the wafer front side or backside, the wafer backside and/or front side can be post-processed in an etching chamber, a chemical vapor deposition (CVD) system, physical vapor deposition (PVD) system, electrochemical deposition (ECD) system, an atomic layer deposition (ALD) system, a lithographic processing system (including coater and stepper) module, etc.

Of course, it must be noted that wafer pre-processing may be performed in any other apparatus, systems, and modules capable of providing other substrate preparation operations (e.g., spin, rinse, and dry module, proximity vapor process module, rapid thermal processing systems, etch systems, etc.).

For additional information about the proximity vapor clean and dry system, reference can be made to an exemplary system described in the U.S. Pat. No. 6,488,040, issued on Dec. 3, 2002, having inventors John M. de Larios, Mike Ravkin, Glen Travis, Jim Keller, and Wilbur Krusell, and entitled "CAPILLARY PROXIMITY HEADS FOR SINGLE WAFER CLEANING AND DRYING." This U.S. Patent Application, which is assigned to Lam Research Corporation, the assignee of the subject application, is incorporated herein by reference.

For additional information with respect to the proximity head, reference can be made to an exemplary proximity head, as described in the U.S. Pat. No. 6,616,772, issued on Sep. 9, 2003, having inventors John M. de Larios, Mike Ravkin, Glen Travis, Jim Keller, and Wilbur Krusell, and entitled "METHODS FOR WAFER PROXIMITY CLEANING AND DRYING." This U.S. Patent Application, which is assigned to Lam Research Corporation, the assignee of the subject application, is incorporated herein by reference.

For additional information about top and bottom meniscus, reference can be made to the exemplary meniscus, as disclosed in U.S. patent application Ser. No. 10/330,843, filed on Dec. 24, 2002, having inventor Carl Woods, and entitled "MENISCUS, VACUUM, IPA VAPOR, DRYING MANIFOLD." This U.S. Patent Application, which is assigned to Lam Research Corporation, the assignee of the subject application, is incorporated herein by reference.

For additional information about top and bottom meniscus, vacuum, and IPA vapor, reference can be made to the exemplary system, as disclosed in U.S. patent application Ser. No. 10/330,897, filed on Dec. 24, 2002, having inventor Carl Woods, and entitled "SYSTEM FOR SUBSTRATE PROCESSING WITH MENISCUS, VACUUM, IPA VAPOR, DRYING MANIFOLD." This U.S. Patent Application, which is assigned to Lam Research Corporation, the assignee of the subject application, is incorporated herein by reference.

For additional information about proximity processors, reference can be made to the exemplary processor, as disclosed in U.S. patent application Ser. No. 10/404,270, filed on Mar. 31, 2003, having inventors James P. Garcia, Mike Ravkin, Carl Woods, Fred C. Redeker, and John M. de Larios, and entitled "VERTICAL PROXIMITY PROCESSOR." This U.S. Patent Application, which is assigned to Lam Research Corporation, the assignee of the subject application, is incorporated herein by reference.

For additional information about front and back meniscus, reference can be made to the exemplary dynamic meniscus, as disclosed in U.S. patent application Ser. No. 10/404,692, filed on Mar. 31, 2003, having inventors James P. Garcia, John M. de Larios, Michael Ravkin, and Fred C. Redeker, and entitled "METHODS AND SYSTEMS FOR PROCESSING A SUBSTRATE USING A DYNAMIC LIQUID MENISCUS." This U.S. Patent Application, which is assigned to Lam Research Corporation, the assignee of the subject application, is incorporated herein by reference.

For additional information about meniscus, reference can be made to the exemplary dynamic liquid meniscus, as disclosed in U.S. patent application Ser. No. 10/603,427, filed on Jun. 24, 2003, having inventors Carl A. Woods, James P. Garcia, and John M. de Larios, and entitled "METHODS AND SYSTEMS FOR PROCESSING A BEVEL EDGE SUBSTRATE USING A DYNAMIC LIQUID MENISCUS." This U.S. Patent Application, which is assigned to Lam Research Corporation, the assignee of the subject application, is incorporated herein by reference.

For additional information about proximate cleaning and/or drying, reference can be made to the exemplary wafer process, as disclosed in U.S. patent application Ser. No. 10/606,022, filed on Jun. 24, 2003, having inventors John M. Boyd, John M. de Larios, Michael Ravkin, and Fred C. Redeker, and entitled "SYSTEM AND METHOD FOR INTEGRATING IN-SITU METROLOGY WITHIN A WAFER PROCESS." This U.S. Patent Application, which is assigned to Lam Research Corporation, the assignee of the subject application, is incorporated herein by reference.

For additional information about depositing and planarizing thin films of semiconductor wafers, reference can be made to the exemplary apparatus and method, as disclosed in U.S. patent application Ser. No. 10/607,611, filed on Jun. 27, 2003, having inventors John Boyd, Yezdi N. Dordi, and John M. de Larios, and entitled "APPARATUS AND METHOD FOR DEPOSITING AND PLANARIZING THIN FILMS OF SEMICONDUCTOR WAFERS." This U.S. Patent Application, which is assigned to Lam Research Corporation, the assignee of the subject application, is incorporated herein by reference.

For additional information about cleaning a substrate using megasonic cleaning, reference can be made to the exemplary method and apparatus, as disclosed in U.S. patent application Ser. No. 10/611,140, filed on Jun. 30, 2003, having inventors John M. Boyd, Mike Ravkin, Fred C. Redeker, and John M. de Larios, and entitled "METHOD AND APPARATUS FOR CLEANING A SUBSTRATE USING MEGASONIC POWER." This U.S. Patent Application, which is assigned to Lam Research Corporation, the assignee of the subject application, is incorporated herein by reference.

For additional information about proximity brush cleaning, reference can be made to the exemplary proximity brush, as disclosed in U.S. patent application Ser. No. 10/742,303, filed on Dec. 18, 2003, having inventors John M. Boyd, Michael L. Orbock, and Fred C. Redeker, and entitled "PROXIMITY BRUSH UNIT APPARATUS AND METHOD." This U.S. Patent Application, which is assigned to Lam Research Corporation, the assignee of the subject application, is incorporated herein by reference.

Various proximity heads and methods of using the proximity heads are described in co-owned U.S. patent application Ser. No. 10/834,548 filed on Apr. 28, 2004 and entitled "APPARATUS AND METHOD FOR PROVIDING A CONFINED LIQUID FOR IMMERSION LITHOGRAPHY," which is a continuation in part of U.S. patent application Ser. No. 10/606,022, filed on Jun. 24, 2003 and entitled "SYSTEM AND METHOD FOR INTEGRATING IN-SITU METROLOGY WITHIN A WAFER PROCESS." Additional embodiments and uses of the proximity head are also disclosed in U.S. patent application Ser. No. 10/404,692, filed on Mar. 31, 2003, entitled "METHODS AND SYSTEMS FOR PROCESSING A SUBSTRATE USING A DYNAMIC LIQUID MENISCUS." Additional information with respect to proximity cleaning can be found in U.S. patent application Ser. No. 10/817,355 filed on Apr. 1, 2004 entitled "SUBSTRATE PROXIMITY PROCESSING STRUCTURES AND METHODS FOR USING AND MAKING THE SAME," U.S. patent application Ser. No. 10/817,620 filed on Apr. 1, 2004 entitled "SUBSTRATE MENISCUS INTERFACE AND METHODS FOR OPERATION," and U.S. patent application Ser. No. 10/817,133 filed on Apr. 1, 2004 entitled "PROXIMITY MENISCUS MANIFOLD." The aforementioned patent applications are hereby incorporated by reference in their entirety.

Yet further, in one exemplary implementation, the proximity preparation system of the present invention can be implemented in a clustered wafer preparation apparatus that may be controlled in an automated way by a control station. For instance, the clustered preparation apparatus may include a sender station, a proximity wafer preparation module, and a receiver station. Broadly stated, wafers initially placed in the sender station are delivered, one-at-a-time, to the proximity wafer preparation module. After being proximity prepared, dry and clean wafers are then delivered to the receiver station for being stored temporarily. As appreciated, the wafer surfaces do not need to be rinsed by rinse water prior to storing the wafer to the receiver station. One of ordinary skill in the art must appreciate that in one embodiment, the clustered preparation apparatus can be implemented to carry out a plurality of different substrate preparation operations (e.g., cleaning, etching, buffing, etc.).

Although the foregoing invention has been described in some detail for purposes of clarity of understanding, it will be apparent that certain changes and modifications may be practiced within the scope of the appended claims. For example, the embodiments of the present invention can be implemented to clean any substrate having varying sizes and shapes such as those employed in the manufacture of semiconductor devices, flat panel displays, hard drive discs, flat panel displays, and the like. Additionally, the present embodiments are to be considered as illustrative and not restrictive, and the invention is not to be limited to the details given herein, but may be modified within the scope and equivalents of the appended claims.

What is claimed is:

1. A method for preparing a surface of a substrate, the substrate being a semiconductor wafer, the method comprising:

exposing a first area of the surface of the substrate to a first proximity head dispensing a fluid forming a first meniscus from a distance of between about 0.5 mm and about 4.5 mm between the first proximity head and the surface of the substrate, the fluid being a chemistry;

exposing a second area of the surface of the substrate to the first meniscus by translating the substrate relative to the proximity head;

applying a vacuum to remove the fluid from the first area while the substrate is translating, the vacuum being applied through a plurality of ports integrated within the first proximity head, the removal of the fluid leaving a precipitate in a dry state on the surface of the substrate in the first area that was exposed to the first meniscus and then to the vacuum; and upon completing the applying of the vacuum to leave the precipitate in the dry state, exposing the first area of the surface of the substrate to a second fluid forming a second meniscus using a second proximity head that is positioned at the distance and arranged beside the first proximity head, the exposure of the first area to the second meniscus occurring immediately after the first area has emerged from the first proximity head in the dry state, the second fluid reacting with the precipitate to form a desired layer on the first area of the substrate;

the second proximity head being arranged beside the first proximity head provides at least one phase when the first meniscus and the second meniscus are over the substrate at a same time, and the second meniscus is applied to the first area without applying a deionized water meniscus after exposure to the first meniscus.

2. The method as recited in claim 1, wherein applying a vacuum to the substrate results in the first area of the surface of the substrate to be dry.

3. The method as recited in claim 1, wherein the second meniscus is formed using a fluid having a substrate surface preparation property.

4. The method as recited in claim 1, wherein the second meniscus passivates a seed layer onto the surface of the substrate that was prepared.

5. The method as recited in claim 1, wherein the first fluid includes one of a hydrofluoric acid, standard clean 1 (SC1), standard clean 2 (SC2), ammonia, a surfactant, acidic acid, citric acid, a combination of acidic acid and citric acid, a combination of acidic acid, citric acid, and the surfactant, ammonium fluoride, mixed copper clean (MCC) 2500, MCC3000, and mixture of sulfuric acid and hydrogen peroxide, but not including de-ionized water.

6. The method of claim 1, wherein the first meniscus moves off of the substrate first followed by the second meniscus moving off the substrate, as the wafer moves past the first and second proximity heads.

7. A method for preparing a surface of a substrate, the substrate being a semiconductor wafer, the method comprising:

applying a first fluid from a first proximity head to form a first meniscus from a distance of between about 0.5 mm and about 4.5 mm between the surface of the substrate and the first proximity head so as to prepare the surface of the substrate, the first fluid being a chemistry to promote chemical treatment of the surface of the substrate;

transitioning the prepared surface away from the first meniscus while applying a vacuum to remove residual first fluid from the prepared surface, the removal of the first fluid leaving behind a precipitate in a dry state on the prepared surface; and applying a second fluid from a second proximity head that is arranged beside the first proximity head and is positioned at the distance, to form a second meniscus between the prepared surface of the substrate and the second proximity head, the second meniscus being applied to the substrate while the first meniscus is over another part of the substrate, the second fluid reacting with the precipitate to form a desired layer on the surface of the substrate, the application of the second fluid being substantially directly after the application of the first fluid;

the second meniscus is applied to the prepared surface without applying a deionized water meniscus after applying the first meniscus.

8. The method as recited in claim 7, wherein the operation of transitioning the prepared surface away from the first meniscus leaves the surface of the substrate substantially dry.

9. The method as recited in claim 7, wherein the fluid of the first meniscus includes one of a hydrofluoric acid, standard clean 1 (SC1), standard clean 2 (SC2), ammonia, a surfactant, acidic acid, citric acid, a combination of acidic acid and citric acid, a combination of acidic acid, citric acid, and the surfactant, ammonium fluoride, mixed copper clean (MCC) 2500, MCC3000, and mixture of sulfuric acid and hydrogen peroxide, but not including pure de-ionized water.

10. The method as recited in claim 7, wherein the first meniscus and the second meniscus are applied onto the substrate surface and the surface of the substrate that was prepared, respectively, substantially synchronously.

11. The method of claim 7, wherein the first meniscus moves off of the substrate first followed by the second meniscus moving off the substrate, as the wafer moves past the first and second proximity heads.

12. A method for preparing a surface of a substrate, the substrate being a semiconductor wafer, the method comprising:

applying a first fluid meniscus over a first region of the substrate, the first fluid meniscus being a chemistry that that leaves a precipitate at the first region after the first fluid meniscus is removed from the first region, leaving the first region in a dry state; and applying a second fluid meniscus over the first region, the second fluid meniscus being a chemistry that transforms the precipitate to a layer over the first region;

each of the first and second fluid menisci is applied from a respective proximity head that does not touch the surface of the substrate, and the second fluid meniscus is applied to the substrate while the first fluid meniscus is over another part of the substrate;

the second fluid meniscus is applied over the first region without first applying a deionized water meniscus to the dry state of the first region having the precipitate.

13. The method as recited in claim 12, wherein the chemistry of the first fluid meniscus is defined by one of a hydrofluoric acid, standard clean 1 (SC1), standard clean 2 (SC2), ammonia, a surfactant, acidic acid, citric acid, a combination of acidic acid and citric acid, a combination of acidic acid, citric acid, and the surfactant, ammonium fluoride, mixed copper clean (MCC) 2500, MCC3000, and mixture of sulfuric acid and hydrogen peroxide, but not including de-ionized water.

14. The method of claim 12, wherein the first fluid meniscus moves off of the substrate first followed by the second fluid meniscus moving off the substrate, as the wafer moves past the first and second proximity heads.

* * * * *